(12) United States Patent
Shih et al.

(10) Patent No.: US 8,011,811 B2
(45) Date of Patent: *Sep. 6, 2011

(54) ASPHERICAL LED ANGULAR LENS FOR CENTRAL DISTRIBUTION PATTERNS AND LED ASSEMBLY USING THE SAME

(75) Inventors: Bo-Yuan Shih, Taipei (TW); Kai Mou Lin, Taipei (TW); Yi-Fan Liao, Taipei (TW); San-Woei Shyu, Taipei (TW)

(73) Assignee: E-Pin Optical Industry Co., Ltd., Taipei (TW)

( * ) Notice: Subject to any disclaimer, the term of this patent is extended or adjusted under 35 U.S.C. 154(b) by 213 days.

This patent is subject to a terminal disclaimer.

(21) Appl. No.: 12/489,377

(22) Filed: Jun. 22, 2009

(65) Prior Publication Data

US 2009/0323352 A1    Dec. 31, 2009

(30) Foreign Application Priority Data

Jun. 30, 2008    (TW) .............................. 97124649 A

(51) Int. Cl.
*F21V 3/00*    (2006.01)
*F21V 5/00*    (2006.01)

(52) U.S. Cl. ..................... 362/311.02; 362/335; 362/800

(58) Field of Classification Search ............. 362/311.02, 362/335, 800

See application file for complete search history.

(56) References Cited

U.S. PATENT DOCUMENTS

| | | | |
|---|---|---|---|
| 7,344,902 B2 | 3/2008 | Basin et al. | |
| 7,345,416 B2 | 3/2008 | Erchak | |
| 7,352,011 B2 | 4/2008 | Smits et al. | |
| 2005/0162854 A1 | 7/2005 | Finch | |
| 2006/0076568 A1 | 4/2006 | Keller et al. | |
| 2006/0105485 A1 | 5/2006 | Basin et al. | |
| 2006/0187653 A1 | 8/2006 | Olsson | |
| 2007/0114551 A1 | 5/2007 | Kawaguchi et al. | |
| 2007/0152231 A1 | 7/2007 | Destain | |

FOREIGN PATENT DOCUMENTS

| | | |
|---|---|---|
| CN | 200710118965.0 | 6/2007 |
| CN | 101013193 | 8/2007 |
| ES | 2157829 | 8/2001 |
| JP | 60007425 | 1/1985 |
| JP | 3032069 | 2/1991 |
| JP | 2002111068 | 4/2002 |

(Continued)

OTHER PUBLICATIONS

English Abstract of JP60007425.
English Abstract of ES2157829.
English Abstract of JP3032069.
English Abstract of JP2002111068.

(Continued)

*Primary Examiner* — Jason Moon Han
(74) *Attorney, Agent, or Firm* — WPAT, P.C.; Anthony King

(57) ABSTRACT

The present invention discloses an aspherical LED angular optical lens for central distribution patterns and an LED assembly using the same. The optical lens comprises a concave surface on a source side and a convex surface on an project side. The LED assembly comprising the optical lens can accumulate light emitted from the LED die and generate a peak intensity of the central angular circle distribution pattern which is greater than 72° and smaller than 108°. The present invention only uses a single optical lens capable of accumulating light and forming a required distribution pattern to satisfy the requirement of a luminous flux ratio greater than 85% and the requirement of an illumination, a flash light of a cell phone or a flash light of a camera.

8 Claims, 13 Drawing Sheets

FOREIGN PATENT DOCUMENTS

| | | |
|---|---|---|
| JP | 2002221658 | 8/2002 |
| JP | 2004356512 | 12/2004 |
| JP | 2005203499 | 7/2005 |
| JP | 2005229082 | 8/2005 |
| JP | 2006072874 | 3/2006 |
| JP | 2007115708 | 5/2007 |
| JP | 2007140524 | 6/2007 |
| TW | M332796 | 5/2008 |
| WO | 2007100837 | 9/2007 |

OTHER PUBLICATIONS

English Abstract of JP2002221658.
English Abstract of JP2005203499.
English Abstract of JP2004356512.
English Abstract of JP2005229082.
English Abstract of JP2006072874.
English Abstract of JP2007115708.
English Abstract of JP2007140524.
English Abstract of CN101013193.

ASPHERICAL LED ANGULAR LENS FOR CENTRAL DISTRIBUTION PATTERNS AND LED ASSEMBLY USING THE SAME

BACKGROUND OF THE INVENTION

1. Field of the Invention

The present invention relates to an aspherical LED angular lens for central distribution patterns and its LED assembly, and more particularly to an optical lens applied to an LED light emitting source to produce patterns and an LED assembly composed of the optical lens and applied for LED illumination, and a flash light of a cell phone or a camera.

2. Description of the Related Art

Light emitting diode (LED) has many advantages such as low voltage, low power consumption and long life, and thus it has been used extensively in the areas of indicators and illuminators. Since LED features a simple color light, a mini flat package, LED is commonly used as a flash light of a cell phone or a camera. However, the light source emitted from an LED die is not a point light source, and its brightness is non-uniform. Many researchers in the light collection related field have conducted extensive researches on reducing the size of an LED die, improving the light emission efficiency, and using an optical lens, which are the trends of the related technological development.

The design of LED optical lens can be divided into a primary optical lens and a secondary optical lens, and the primary optical lens is a lens packaged directly on an LED die and generally used for concentrating light, and the secondary optical lens is used in an LED or an LED array primarily used for scattering a light beam. In the designs of conventional primary optical lenses including a symmetrical aspherical lens used in ES2157829, a spherical lens used in Japan Pat. Nos. JP3032069, JP2002-111068 and JP2005-203499, U.S. Pat. No. US2006/187653 and China Pat. No. CN101013193, and a spherical lens used in a bulky LED and disclosed by JP2002-221658. The primary optical lens produces a specific distribution pattern such as a large-angle, a small-angle, a circular or an elliptical pattern at an uniform peak intensity for advanced applications and structures a LED array to give an optimal optical effect, in addition to the concentrating of light. In an application of the primary optical lens as shown in FIG. 1, a lens 23 is covered onto an LED die 21, and a silicon gel is filled between the lens 23 and the LED die 21, and the LED die 21 is a die that emits a blue light, and the silicon gel contains yellow phosphors. When the LED die 21 emits the blue light, the blue light goes through the silicon gel and becomes a white light by wavelength conversion. After the lens 23 concentrates the emitted light. The primary optical lens as disclosed in Japan Pat. Nos. JP2004-356512, JP2005-229082, JP2006-072874, JP2007-140524 and JP2007-115708, U.S. Pat. Nos. US2005/162854, US2006/105485, US2006/076568, US2007/114551, US2007/152231, U.S. Pat. Nos. 7,344,902, 7,345,416, and 7,352,011 and TW Pat. No. M332796 adopt the optical lens to produce a distribution pattern; Japan Pat. No. JP60007425, WIPO Pat. No. WO/2007/100837 produces an elliptical distribution pattern; or China Pat. No. 200710118965.0 produces a rectangular, square or bar-shaped pattern smaller than 160°.

As science and technology advanced, electronic products tend to be developed with a light, thin, short and small design and a multiple of functions, and electronic products including digital still cameras, PC cameras, network cameras and cell phones have a camera lens, or even personal digital assistants (PDA) have installed a lens, and an LED flash light or an LED lamp for illuminations for the products of this sort is composed of one or more LED assemblies to form an array. To facilitate the portability and comply with the user-friendly requirement, the LED flash light or the LED lamp for illuminations not only conforms with the luminous flux, but also works together with LED assemblies in different distribution patterns, while achieving a smaller volume and a lower cost. For the requirements of a primary optical lens of an LED, the manufacture of a conventional primary optical lens with a complicated appearance or an optical lens with a diffractive surface has the drawbacks of a high difficulty of the manufacture, an easy deformation of plastic injection molding, a difficult shaping of glass and a high cost. Therefore, users require a design and an assembly of an easy-to-manufacture LED lens with a simple optical surface, such that a central angular circle distribution pattern can be formed by concentrating light by the LED and a peak intensity can be greater than 72° and smaller than 108°, and the luminous flux ratio can be greater than 85%.

SUMMARY OF THE INVENTION

It is a primary objective of the present invention to overcome the shortcomings of the prior art by providing an aspherical LED angular lens for central distribution patterns, and the lens is applied in an LED assembly. The LED assembly emits light from an LED die, and the optical lens is provided for concentrating light and forming a central angular circle distribution pattern greater than 72° and smaller than 108° by uniform peak intensity. A seal gel is filled between the optical lens and the LED. The optical lens is a lens having a concave surface and a convex surface and made of an optical material, and the concave surface is an optical surface facing the source side of a light source, and the convex surface is an optical surface facing an project side of the light source, and at least one optical surface is aspherical, and the optical lens satisfies the following conditions:

$$0.7 \leq \left| \frac{R_1 - R_2}{R_1 + R_2} \right| \leq 1.0 \quad (1)$$

$$8 \leq \frac{R_1^2}{3 \cdot d_2 \cdot f_s} \leq 180 \quad (2)$$

$$0.2 \leq (N_{d2} - 1)\frac{d_2}{f_s} \leq 0.4 \quad (3)$$

where, $f_s$ is the effective focal length of the optical lens, $R_1$ is the radius of curvature of the optical surface at the source side, $R_2$ is the radius of curvature of the optical surface at the project side, $d_2$ is the thickness of the optical lens at the central axis, and $N_{d2}$ is the refractive index of the optical lens.

To simplify the manufacture, the optical lens can be substituted by an optical lens having flat and convex surfaces, and its flat surface is an optical surface facing the source side of a light source, and its convex surface is an optical surface facing the project side of the light source, and the optical surface of the project side is an aspherical surface, and the optical lens satisfies the conditions of Equations (3) and (4):

$$0.2 \leq (N_{d2} - 1)\frac{d_2}{f_s} \leq 0.4 \quad (3)$$

$$0.5 \leq \frac{(d_0 + d_1 + d_2)}{R_2} < 1.2 \quad (4)$$

where, $R_2$ is the radius of curvature of the optical surface at the project side, $d_0$ is the thickness of the LED die at the central axis, $d_1$ is the distance from the surface of the LED die at the central axis to the optical surface of the optical lens at the source side, and $d_2$ is the thickness of the optical lens at the central axis.

Another objective of the present invention is alternate optical plastic and optical glass to enhance the productability or thermal stability.

A further objective of the present invention is to provide an LED assembly comprising an aspherical LED angular lens for central distribution patterns and an LED die, characterized in that the LED assembly includes a central angular circle distribution pattern greater than 72° and smaller than 108°, and a luminous flux ratio greater than 85% ($\beta/\alpha \geq 85\%$), and the LED assembly satisfies the following condition:

$$5 \leq \frac{\omega - \varphi}{\pi} \cdot f_g \leq 12 \quad (5)$$

where, $$f_g = \left|\left(\frac{1}{R_1} - \frac{1}{R_2}\right) \cdot f_s\right| \quad (6)$$

where, $f_s$ is the effective focal length of the optical lens, fg is the relative focal length of the optical lens, $R_1$ is the radius of curvature of optical surface at the source side, $R_2$ is the radius of curvature of optical surface at the project side, $2\omega$ is the maximum angle of the light emitted from the LED die and symmetrical to the central axis, $2\phi$ is the maximum angle of the light projected from the optical lens and symmetrical to the central axis, $\alpha$ is the luminous flux of light emitted from the LED die, and $\beta$ is the luminous flux of the light on the project side at a relative infinite distance ($100 \times f_s$) neglected the refraction and scattering in the air.

With the optical lens and the LED assembly composed of the optical lens according to the present invention, a central angular circle distribution pattern greater than 72° and smaller than 108° and a luminous flux ratio greater than 85% can be achieved to meet the requirements, and the optical lens comes with a simple shape, a thin thickness and an easy-to-manufacture feature, such that the optical lens can be applied in a single LED or an array of LEDs and used for illuminations or as a flash light for a cell phone or a camera.

DETAILED DESCRIPTION OF THE PREFERRED EMBODIMENTS

The present invention will become apparent in the following detailed description of the preferred embodiments with reference to the accompanying drawings.

Figure 1:
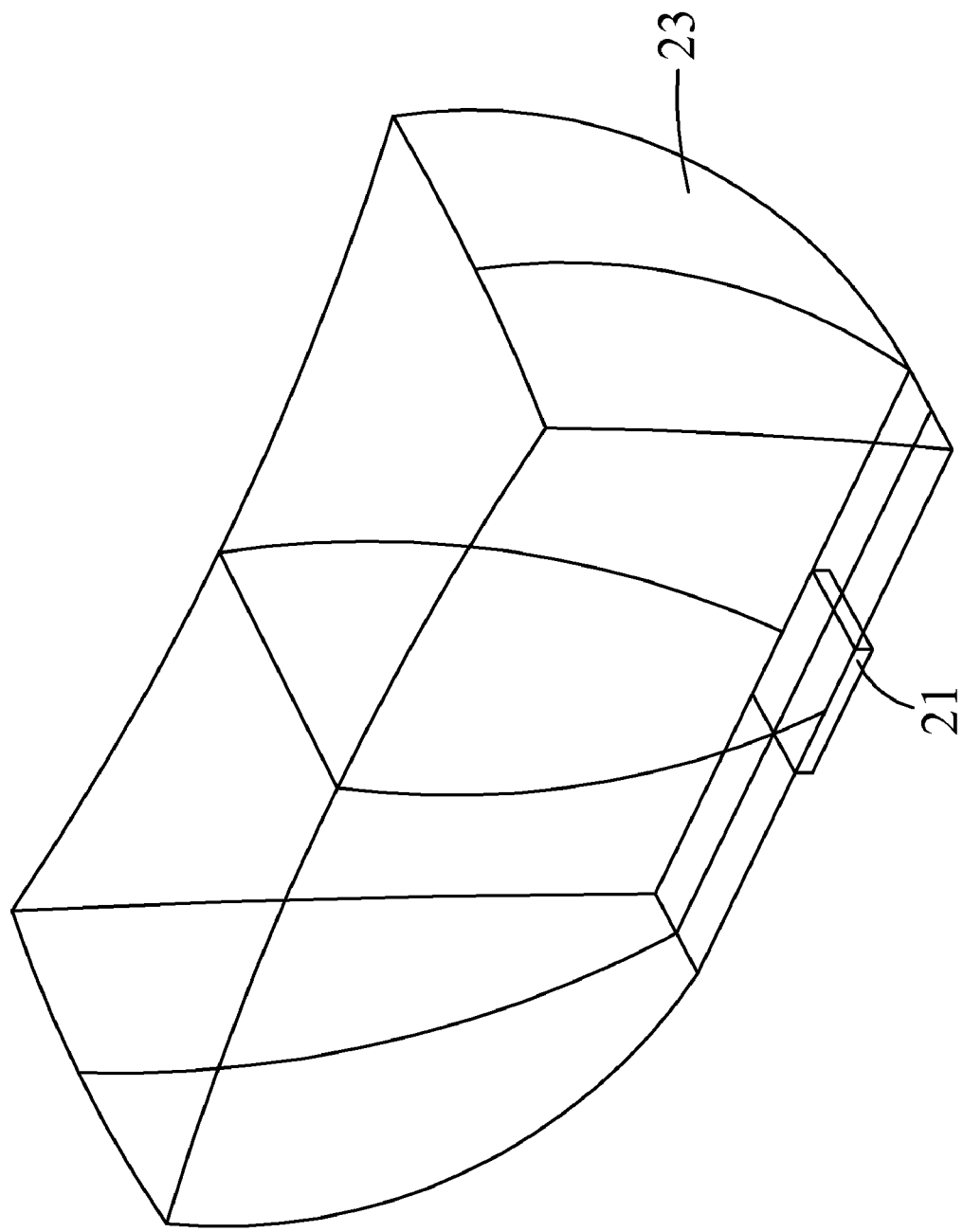
FIG. 1 is a schematic view of an LED assembly using an LED optical lens in accordance with a prior art.
Figure 2:
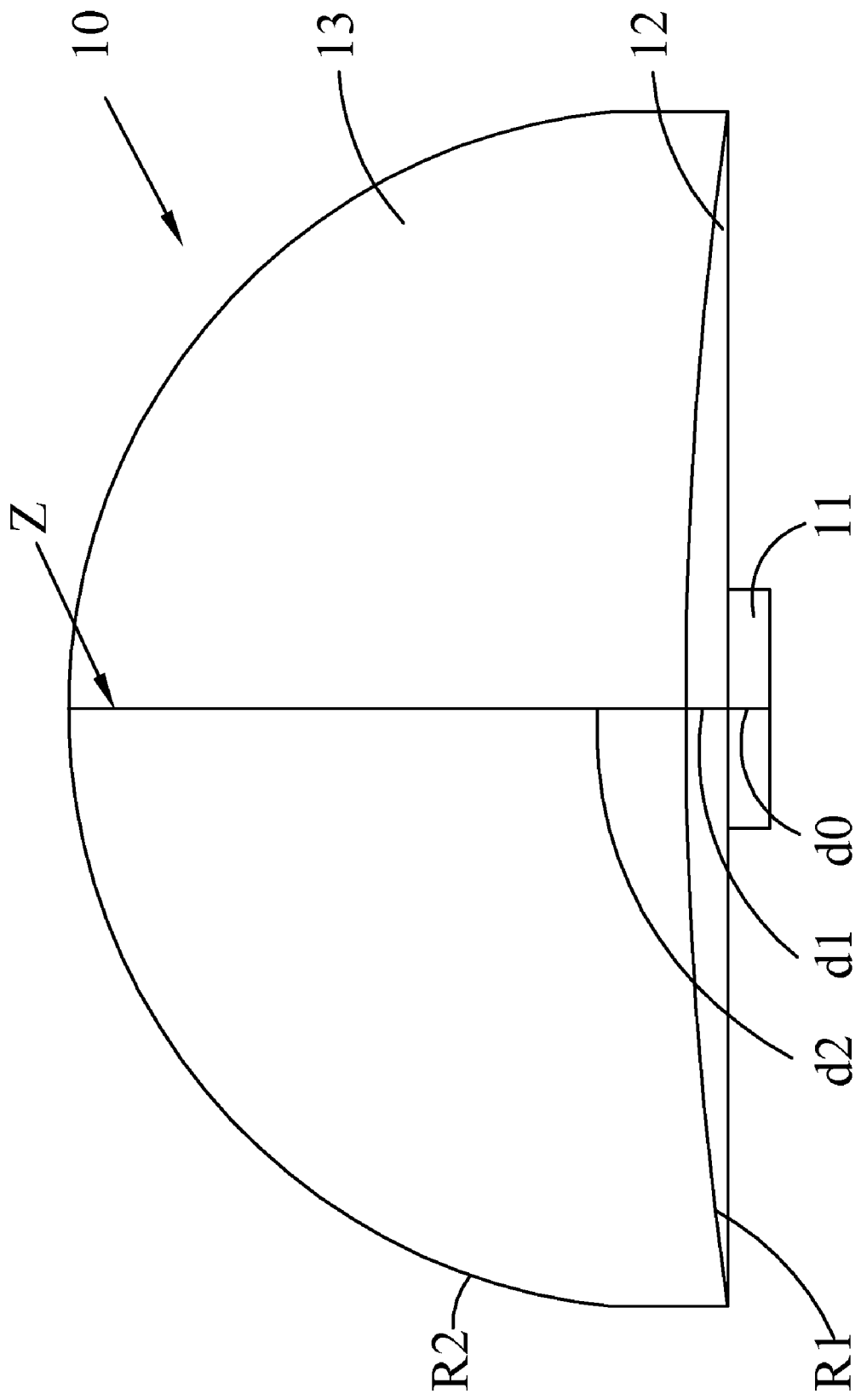
FIG. 2 is a schematic view of an LED assembly using an LED optical lens in accordance with the present invention.

With reference to FIG. 2 for a schematic view of an aspherical LED angular lens for central distribution patterns and an LED assembly using the lens in accordance with the present invention, an LED die 11, a seal gel 12 and an optical lens 13 are arranged sequentially along a central axis Z from a source side to a project side. After a light is emitted from the LED die 11 and passed through the seal gel 12, the optical lens 13 concentrates the light and forms a light beam with a central angular circle distribution pattern greater than 72° and smaller than 108° and symmetrical to the central axis Z and projects the light beam onto the project side. The optical lens 13 is a lens having a concave surface and a convex surface and made of an optical material, and the concave surface is optical surface $R_1$ facing the source side of the light source, and the convex surface is an optical surface $R_2$ facing the project side of the light source, and at least one optical surface is aspherical. The optical surfaces $R_1$, $R_2$ and the effective focal length of the optical lens 13 satisfy the conditions of Equations (1), (2) and (3), and an emitting angle $2\omega$ of the LED die 11 and an angle $2\phi$ of the distribution pattern formed by the peak intensity of the optical lens 13 satisfy the condition of Equation (5).

The seal gel 12 used for the LED assembly includes but not limited to a common optical resin or a silicon gel.

Figure 4:
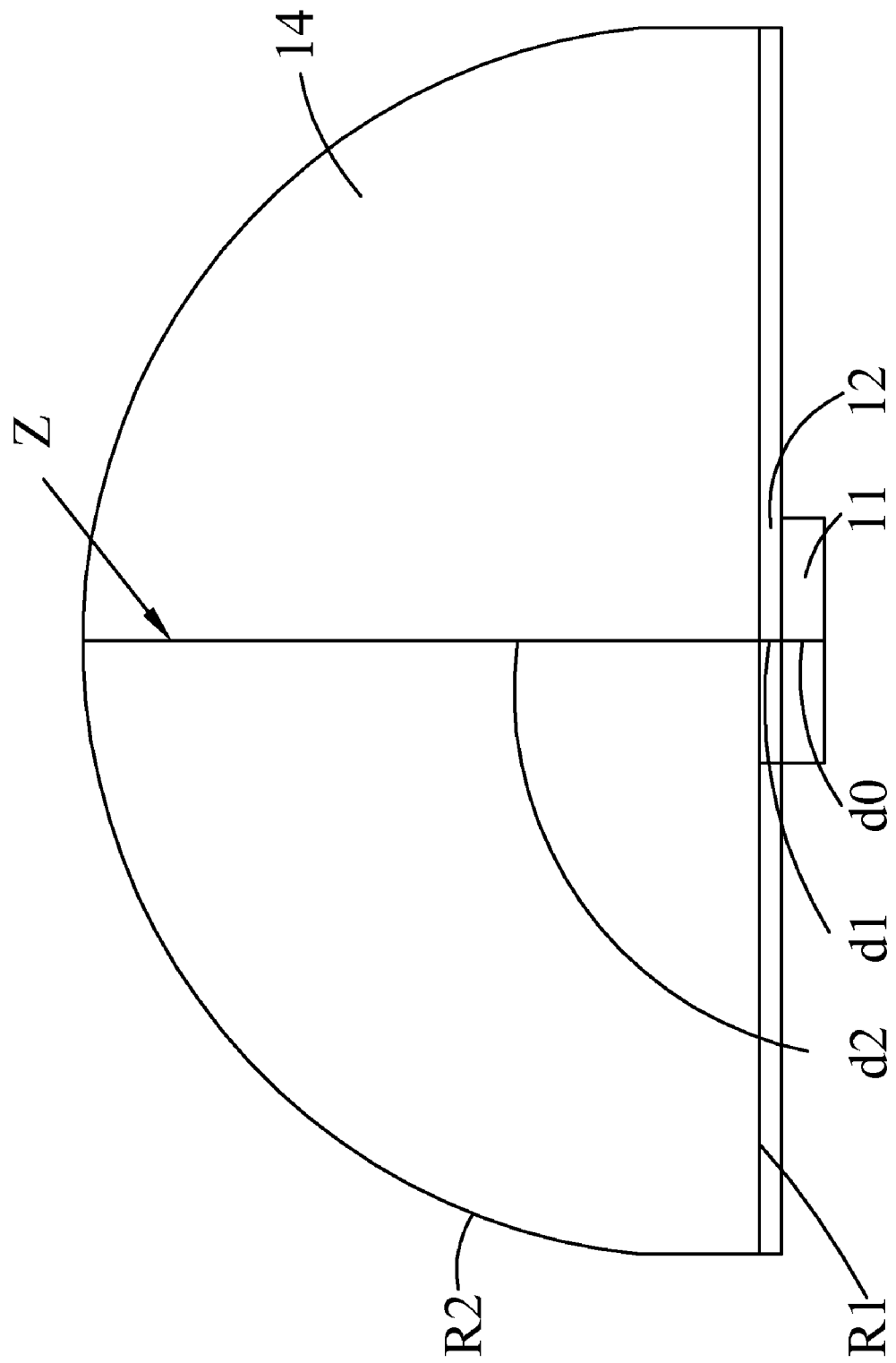
FIG. 4 is a schematic view of an LED assembly using an LED optical lens with flat and convex surfaces in accordance with the present invention.

With reference to FIG. 4 for a schematic view of an LED assembly using an LED optical lens with flat and convex surfaces in accordance with the present invention, an LED die 11, a seal gel 12 and an optical lens 14 with a flat surface and a convex surface are arranged sequentially along a central axis Z from a source side to a project side. After a light is emitted from the LED die 11 and passed through the seal gel 12, the optical lens 14 concentrates the light and forms a light beam with a central angular circle distribution pattern greater than 72° and smaller than 108° and symmetrical to the central axis Z and projects the light beam onto the project side. The optical lens 14 is made of an optical material, and the flat surface is an optical surface $R_1$ facing the source side of the light source, and the convex surface is an optical surface $R_2$ facing the project side of the light source, and the optical surface $R_2$ is aspherical. The optical surfaces $R_1$, $R_2$ and the effective focal length of the optical lens 14 satisfy the conditions of Equations (3) and (4), and an emitting angle $2\omega$ of the optical lens 13 and an angle $2\phi$ of the distribution pattern formed by the peak intensity of the optical lens 13 satisfy the condition of Equation (5).

With reference to FIGS. 2 and 4, the optical surfaces $R_1$, $R_2$ of the optical lens 13 or the optical surface $R_2$ of the optical lens 14 are shown. If the optical surfaces $R_1$, $R_2$ of the optical lens 13 are aspherical optical surfaces, the aspherical surface formula is shown in Equation (7):

$$Z = \frac{ch^2}{1 + \sqrt{(1-(1+K)c^2h^2)}} + A_4h^4 + A_6h^6 + A_8h^8 + A_{10}h^{10} \quad (7)$$

where, c is the curvature of the lens, h is the height of the lens, K is the conic constant of the lens, and $A_4$, $A_6$, $A_8$ and $A_{10}$ are the $4^{th}$, $6^{th}$, $8^{th}$ and $10^{th}$ order aspherical coefficients respectively.

Figure 3:
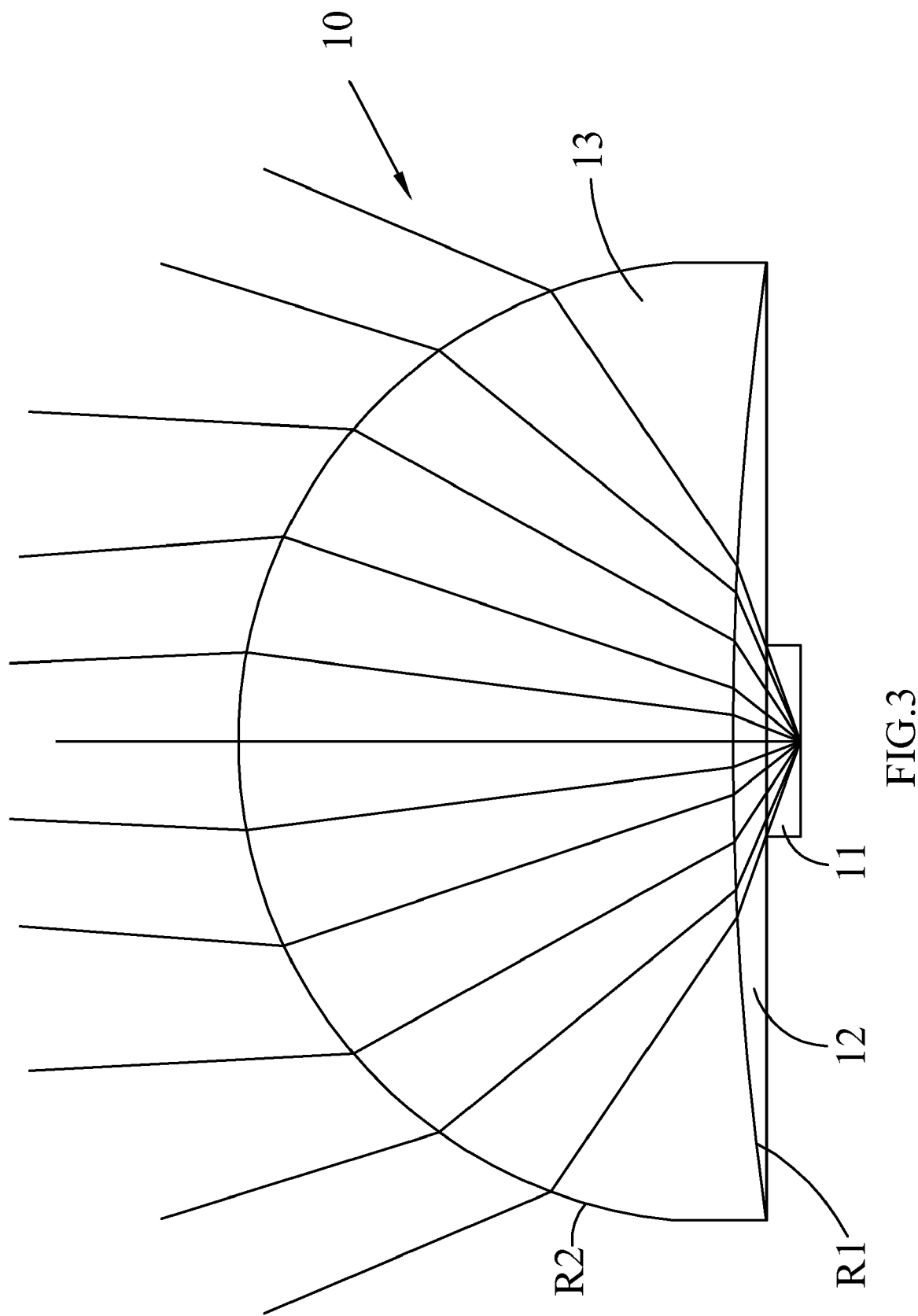
FIG. 3 is a schematic view of an optical path of an LED optical lens in accordance with the present invention.

With reference to FIG. 3 for a schematic view of an optical path of the present invention, the maximum angle of light emitted from the LED die 11 is equal to $2\omega$ (symmetrical to the central axis Z), and the light is concentrated and refracted by the optical lens 13 to form a required distribution pattern by the angle $2\phi$ (symmetrical to the central axis Z) and satisfy the requirement $\beta/\alpha \geq 70\%$, where $\alpha$ is the luminous flux of the light emitted from the LED die, and $\beta$ is the luminous flux of the project side of the LED assembly at a relative infinite distance ($100 \times f_s$) neglected the refraction and scattering in the air, provided that the refraction and scattering effects of the air are neglected, and the optical lens 13 is made of optical glass or optical plastic.

Figure 5:
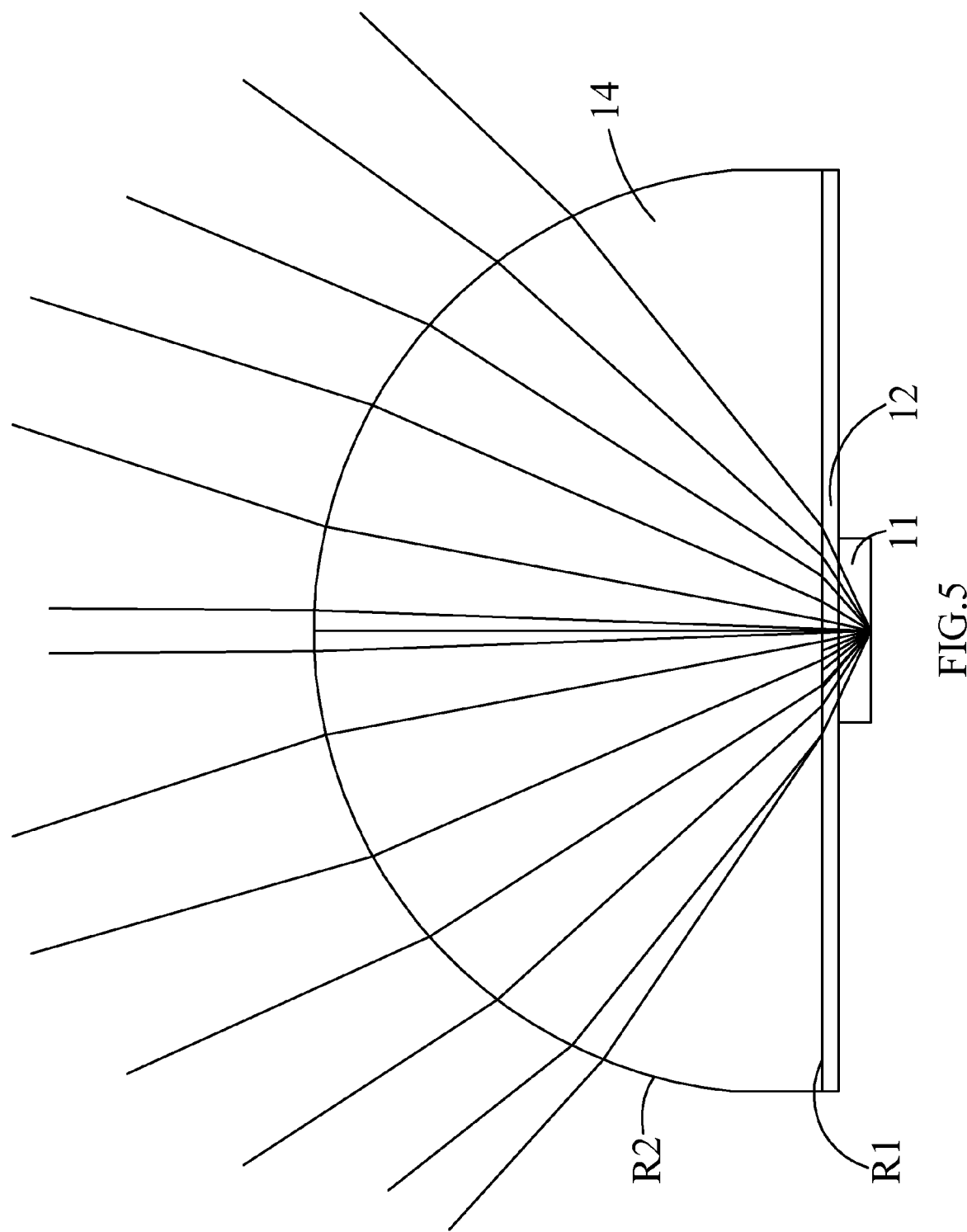
FIG. 5 is a schematic view of an optical path of an LED assembly using an LED optical lens with flat and convex surfaces in accordance with the present invention.

With reference to FIG. 5 for a schematic view of an optical path of an LED assembly using an LED optical lens with flat and convex surfaces in accordance with the present invention, the requirements of the maximum angle $2\phi$ of the light emitted from the LED die 11 is (symmetrical to the central axis Z), the distribution pattern formed by a light concentrated and refracted at the angle $2\phi$ by the optical lens 14 and $\beta/\alpha \geq 85\%$ are satisfied, where $\alpha$ is the luminous flux of the light emitted from the LED die, and $\beta$ is the luminous flux of the project side of the LED assembly at a relative infinite distance ($100 \times f_s$) neglected the refraction and scattering in the air, provided that the refraction and scattering effects of the air are neglected, and the optical lens 14 is made of an optical glass or optical plastic material.

With the structure described above, the LED assembly composed of an aspherical LED angular lens for central distribution patterns complies with a central angular circle distribution pattern greater than 72° and smaller than 108°, such that the LED assembly 10 can emit a predetermined pattern and comply with the requirement of a luminous flux ratio greater than 85% ($\beta/\alpha \geq 85\%$), and a single LED assembly or an array of LED assemblies for different distribution patterns can be used.

In the embodiments of the present invention, a 1.0 mm×1.0 mm die is used for illustrating the LED die 11, and an optical lens 13 with a diameter of 5 mm is used for illustrating each embodiment, but the size of the LED die 11 and the diameter of the optical lens 13 are not limited to the aforementioned dimensions.

In Embodiments 1 to 4, an LED assembly is formed by an optical lens with a concave surface and a convex surface; and in Embodiments 5 to 8, an LED assembly is formed by an optical lens with a flat surface and a convex surface.

Embodiment 1

Figure 6:
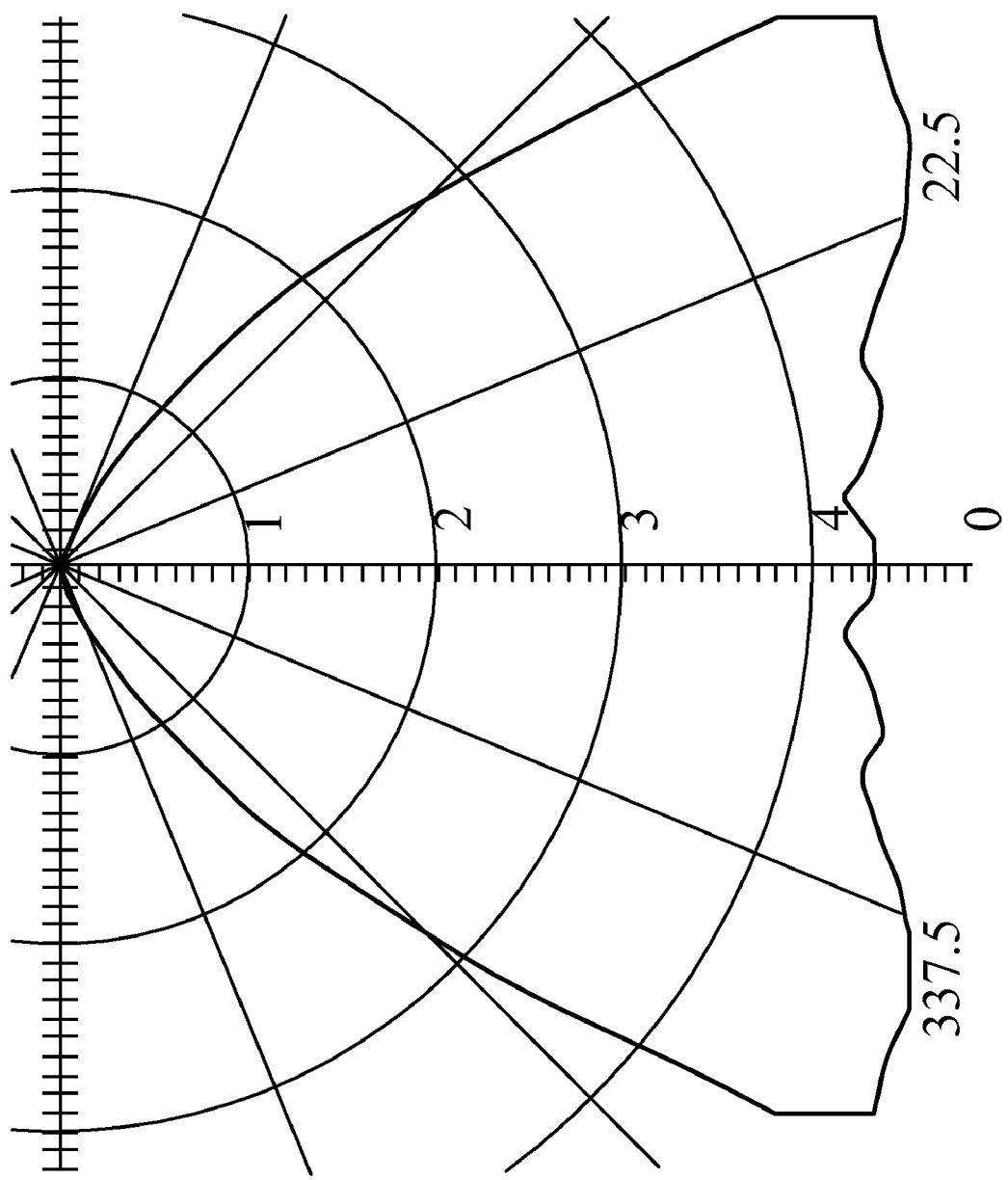
FIG. 6 is a schematic view of polar coordinates of a peak intensity distribution and an illumination angle of an LED assembly in accordance with a first preferred embodiment of the present invention.

Refer to FIGS. 2 and 6 for a schematic view of an LED assembly using an optical lens and a schematic view of polar coordinates of a peak intensity distribution and an illumination angle of an LED assembly in accordance with a first preferred embodiment of the present invention respectively.

In Table (1), the LED die 11, the seal gel 12 and the optical lens 13 are arranged from the source side to the project side along the central axis Z, wherein the radius of curvature R (unit: mm) of the optical lens 13 at the optical surface $R_1$ of the source side, the radius of curvature R (unit: mm) of the optical lens 13 at the optical surface $R_2$ of the project side, and the distance d (which is the on-axis surface spacing) (unit: mm) are shown, and the maximum angle of the light emitted from the LED die 11 is equal to $2\omega$ (unit: degree), and the maximum angle of the light with the distribution pattern projected from the optical lens 13 is equal to $2\phi$ (unit: degree), and each refractive index ($N_d$), each Abbe's number ($v_d$), and each thickness are shown.

TABLE (1)

| $2\omega = 130$ $2\phi = 92$ | | | | |
|---|---|---|---|---|
| No | Optical Surface | Radius of Curvature | Thickness | Nd | Vd |
| 0 | Light source | | 0.1000 | | |
| 1 | Silicon Gel | | 0.430 | 1.527 | 34 |
| *2 | R1 | 70.000 | 2.300 | 1.583 | 61.7 |
| *3 | R2 | 2.40 | ∞ | | |
| 4 | Project side | | | | |

*Aspherical Surface

In Table (1), the optical surface (Surf) marked with * indicates an aspherical optical surface. In Table (2), coefficients of aspherical Equation (7) for each optical surface are given:

TABLE (2)

| | K | A4 | A6 | A8 | A10 |
|---|---|---|---|---|---|
| *R1 | 3.0000E−01 | −1.0000E−04 | 0.0000E+00 | 0.0000E+00 | 0.0000E+00 |
| *R2 | −1.0000E+00 | −3.0000E−02 | 1.3079E−02 | −1.4006E−04 | −1.9145E−04 |

In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a glass material with the refractive index $N_{d2}$ equal to 1.583, and the Abbe's number $v_{d2}$ equal to 61.7. With the refractive coefficients and Abbe's numbers of the seal gel 12 and the optical lens 13, a light refractive angle is defined. The LED die 11 emits a blue light with $\alpha$=12.15 lumen, and the effective maximum angle=130°, and the effective focal length fs of the optical lens 13 equal to 4.20 mm. The blue light concentrated by the optical lens 13, and projected with a central illumination angle of 92° at a relative infinite distance (which is calculated by 100×fs) and β=11.092 lumen (neglecting the refraction and scattering effect of the air). Equations (1), (2), (3), (5) and (6) are given below:

$$\left|\frac{R_1 - R_2}{R_1 + R_2}\right| = 0.9337$$

$$\frac{R_1^2}{3 \cdot d_2 \cdot f_s} = 169.0802$$

$$(N_{d2} - 1)\frac{d_2}{f_s} = 0.3192$$

$$f_g = \left|\left(\frac{1}{R_1} - \frac{1}{R_2}\right) \cdot f_s\right| = 1.750$$

$$\frac{\omega - \varphi}{\pi} \cdot f_g = 10.5839$$

$$\beta/\alpha = 91.29\%$$

Equations (1), (2), (3) and (5) can be satisfied. FIG. 3 shows the optical path of a light emitted from the LED die 11 and passed through the seal gel 12 and the optical lens 13, and FIG. 6 shows the polar coordinates of a peak intensity distribution and an illumination angle. Tables (1) and (2) and FIG. 6 show that the aspherical LED angular lens for central distribution patterns has a simple shape, and an easy-to-manufacture feature, and the LED assembly has a predetermined pattern, and an uniform peak intensity for each angle, so as to enhance the applicability of the present invention.

Embodiment 2

Figure 7:
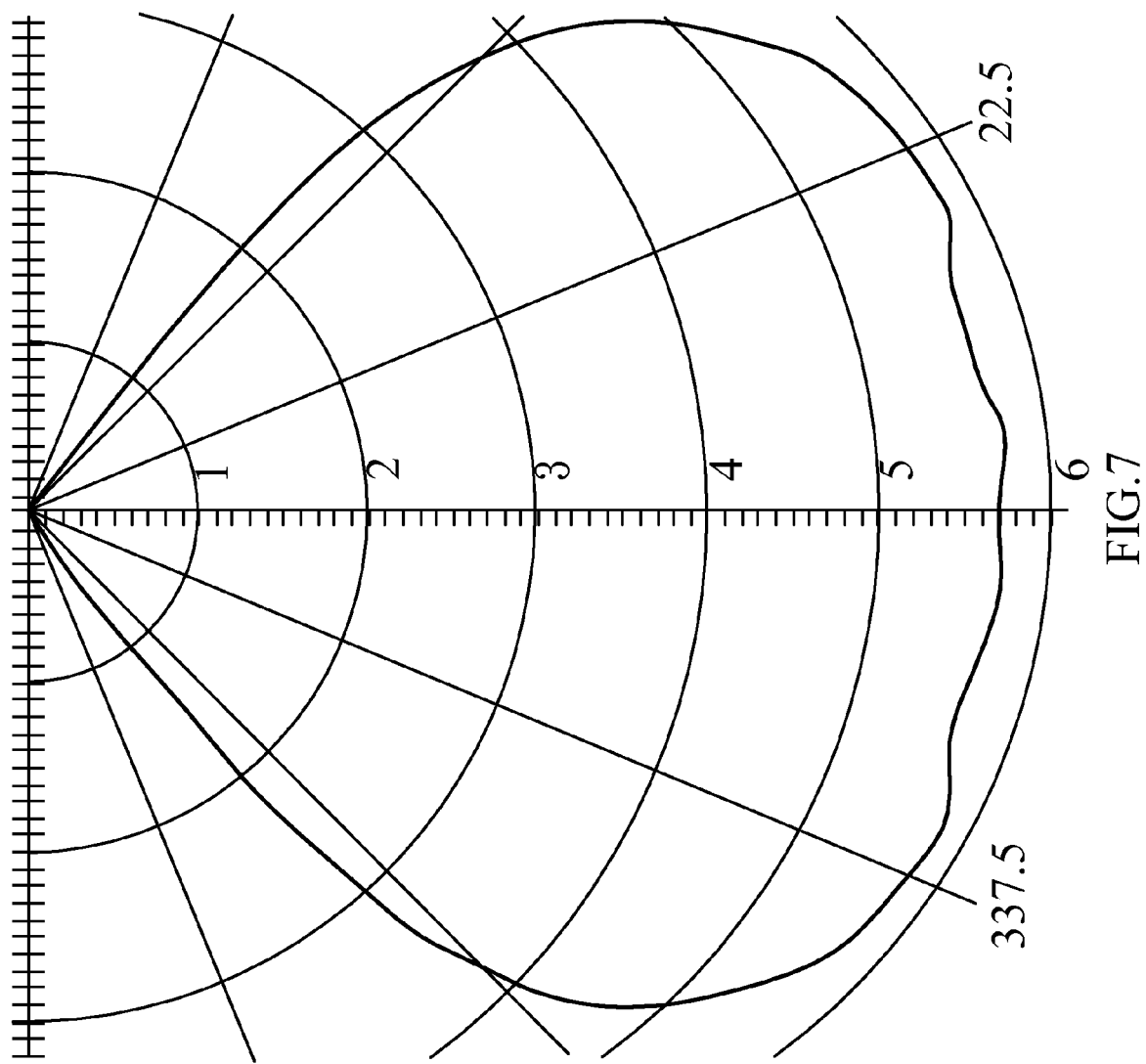
FIG. 7 is a schematic view of polar coordinates of a peak intensity distribution and an illumination angle of an LED assembly in accordance with a second preferred embodiment of the present invention.

Refer to FIGS. 2 and 7 for schematic views of an LED assembly using an optical lens and polar coordinates of a peak intensity distribution and an illumination angle in accordance with a second preferred embodiment of the present invention.

In Table (3), the LED die 11, the seal gel 12 and the optical lens 13 are arranged from the source side to the project side along the central axis Z, wherein the radius of curvature R (unit: mm) of the optical lens 13, and the distance d (which is the on-axis surface spacing) (unit: mm) are shown, and the maximum angle of the light emitted from the LED die 11 is equal to $2\omega$ (unit: degree), and the maximum angle of the light with the distribution pattern projected from the optical lens 13 is equal to $2\phi$ (unit: degree), and each refractive index ($N_d$), each Abbe's number ($v_d$), and each thickness are shown.

TABLE (3)

$2\omega = 110$  $2\phi = 92$

| No | Optical Surface | Radius of Curvature | Thickness | Nd | Vd |
|----|----|----|----|----|----|
| 0 | Light source | | 0.100 | | |
| 1 | Silicon Gel | | 0.430 | 1.527 | 34 |
| *2 | R1 | 20.000 | 2.600 | 1.583 | 61.7 |
| *3 | R2 | 2.975 | | | |
| 4 | Project side | | | | |

*Aspherical Surface

TABLE (4)

| | K | A4 | A6 | A8 | A10 |
|---|---|---|---|---|---|
| *R1 | 1.0000E+00 | −1.0000E−05 | 0.0000E+00 | 0.0000E+00 | 0.0000E+00 |
| *R2 | 4.0000E−01 | 5.0000E−03 | −1.0000E−03 | 3.0000E−04 | −6.3827E−07 |

In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a glass material with the refractive index $N_{d2}$ equal to 1.583, and the Abbe's number $v_{d2}$ equal to 61.7. The LED die 11 emits a blue light with α=12.15 lumen, and the effective maximum angle=120°, and the effective focal length $f_s$ of the optical lens 13 equal to 5.66 mm. The blue light concentrated by the optical lens 13, and projected with a central illumination angle of 92° at a relative infinite distance (which is calculated by 100×$f_s$) and β=11.57 lumen (neglecting the refraction and scattering effect of the air). Equations (1), (2), (3), (5) and (6) are given below:

$$\left|\frac{R_1 - R_2}{R_1 + R_2}\right| = 0.7410$$

$$\frac{R_1^2}{3 \cdot d_2 \cdot f_s} = 9.0579$$

$$(N_{d2} - 1)\frac{d_2}{f_s} = 0.2676$$

$$f_g = \left|\left(\frac{1}{R_1} - \frac{1}{R_2}\right) \cdot f_s\right| = 1.9031$$

$$\frac{\omega - \varphi}{\pi} \cdot f_g = 5.4518$$

$$\beta/\alpha = 95.22\%$$

Equations (1), (2), (3) and (5) can be satisfied. FIG. 7 shows a schematic view of polar coordinates of a peak intensity distribution and an illumination angle of an LED assembly in accordance with a second preferred embodiment of the present invention. Tables (1) and (2) and FIG. 7 show that the aspherical LED angular lens for central distribution patterns has a simple shape, and an easy-to-manufacture feature, and the LED assembly has a predetermined pattern, and an uniform peak intensity for each angle, so as to enhance the applicability of the present invention.

Embodiment 3

Figure 8:
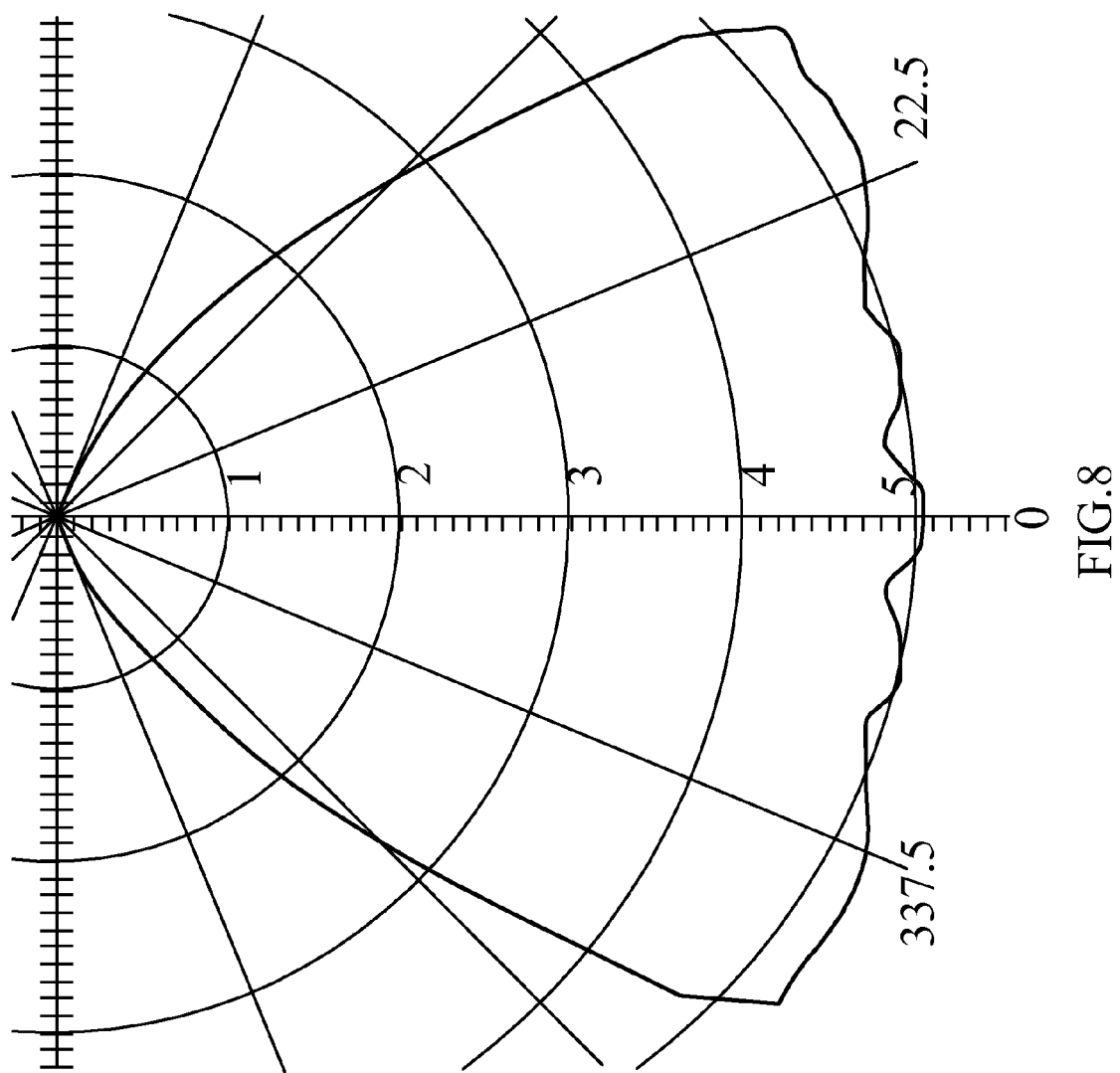
FIG. 8 is a schematic view of polar coordinates of a peak intensity distribution and an illumination angle of an LED assembly in accordance with a third preferred embodiment of the present invention.

Refer to FIGS. 2 and 8 for schematic views of an LED assembly using an optical lens and polar coordinates of a peak intensity distribution and an illumination angle in accordance with a third preferred embodiment of the present invention.

In Table (5), the radius of curvature R of each optical surface from the source side to the project side along the central axis Z, the distance d (which is the on-axis surface spacing), the maximum angle $2\omega$ of the light emitted from the LED die 11, and the maximum angle $2\phi$ of the light with the distribution pattern projected from the optical lens 13, each refractive index ($N_d$), each Abbe's number ($v_d$), and each thickness are shown. Table (6) shows coefficients of aspherical equation (7) of each optical surface.

TABLE (5)

| | | $2\omega = 110$ $2\phi = 91$ | | | |
|---|---|---|---|---|---|
| No | Optical Surface | Radius of Curvature | Thickness | Nd | Vd |
| 0 | Light source | | 0.100 | | |
| 1 | Silicon Gel | | 0.430 | 1.527 | 34 |
| *2 | R1 | 70.000 | 2.300 | 1.583 | 61.7 |
| *3 | R2 | 2.400 | | | |
| 4 | Project side | | | | |

*Aspherical Surface

TABLE (6)

| | K | A4 | A6 | A8 | A10 |
|---|---|---|---|---|---|
| *R1 | 3.0000E−01 | −1.0000E−04 | 0.0000E+00 | 0.0000E+00 | 0.0000E+00 |
| *R2 | −1.0000E+00 | −3.0000E−02 | 1.3079E−02 | −1.4006E−04 | −1.9145E−04 |

In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a glass material with the refractive index $N_{d2}$ equal to 1.583, and the Abbe's number $v_{d2}$ equal to 61.7. The LED die 11 emits a blue light with α=12.15 lumen, and the effective maximum angle=110°, and the effective focal length $f_s$ of the optical lens 13 equal to 4.20 mm. The blue light is concentrated by the optical lens 13, and projected with a central illumination angle of 91° at a relative infinite distance (which is calculated by 100×$f_s$) and β=11.277 lumen (neglecting the refraction and scattering effect of the air). Equations (1), (2), (3), (5) and (6) are given below:

$$\left|\frac{R_1 - R_2}{R_1 + R_2}\right| = 0.9337$$

$$\frac{R_1^2}{3 \cdot d_2 \cdot f_s} = 169.0802$$

$$(N_{d2} - 1)\frac{d_2}{f_s} = 0.3191$$

$$f_g = \left|\left(\frac{1}{R_1} - \frac{1}{R_2}\right) \cdot f_s\right| = 1.7501$$

-continued $$\frac{\omega - \varphi}{\pi} \cdot f_g = 5.2919$$

$$\beta/\alpha = 91.82\%$$

Equations (1), (2), (3) and (5) can be satisfied. FIG. 8 shows a schematic view of polar coordinates of a peak intensity distribution and an illumination angle of an LED assembly in accordance with a third preferred embodiment of the present invention, Tables (1) and (2) and FIG. 8 show that the aspherical LED angular lens for central distribution patterns has a simple shape, and an easy-to-manufacture feature, and the LED assembly has a predetermined pattern, and an uniform peak intensity for each angle, so as to enhance the applicability of the present invention.

Embodiment 4

Figure 9:
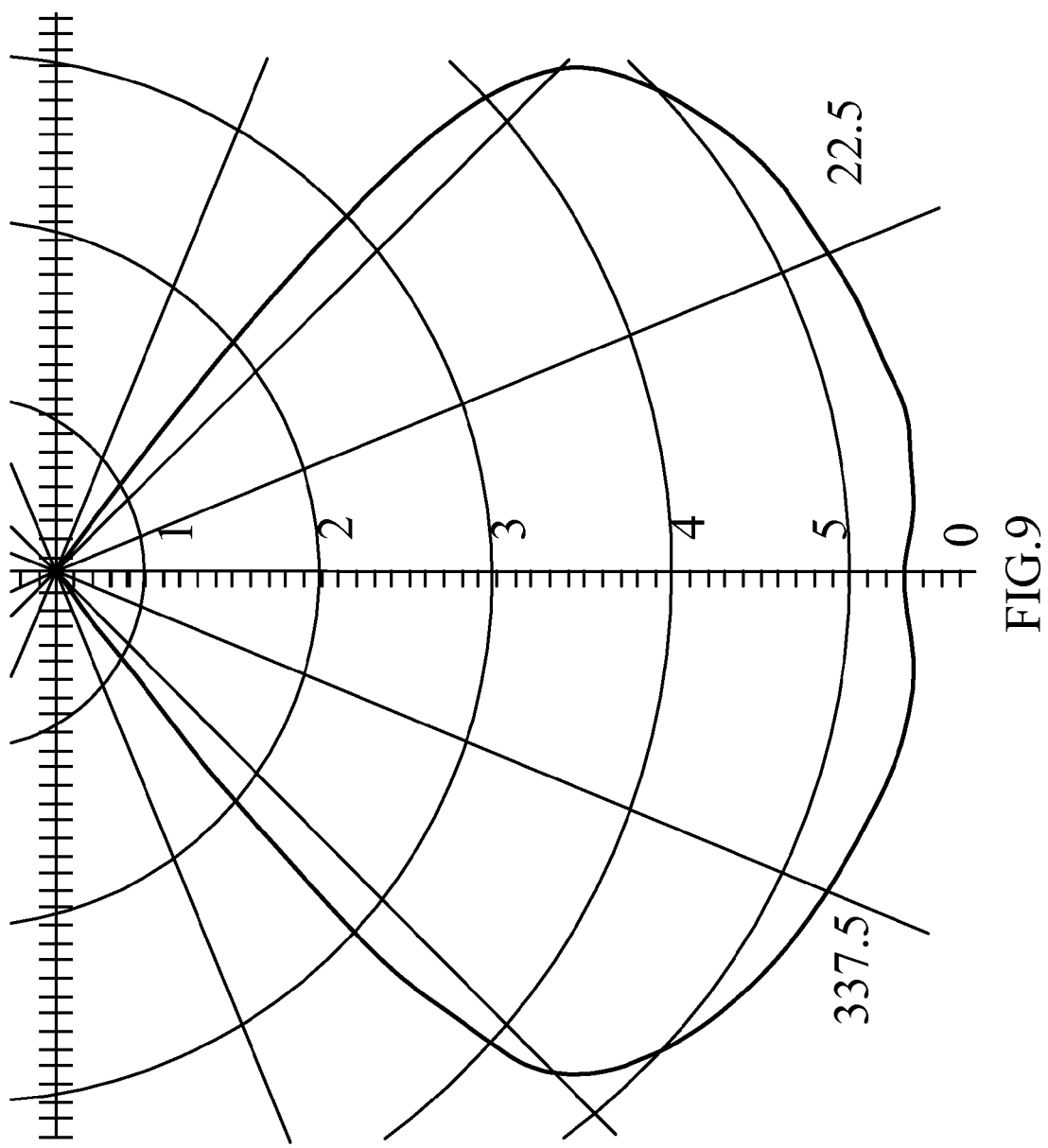
FIG. 9 is a schematic view of polar coordinates of a peak intensity distribution and an illumination angle of an LED assembly in accordance with a fourth preferred embodiment of the present invention.

Refer to FIGS. 2 and 9 for schematic views of an LED assembly using an optical lens and polar coordinates of a peak intensity distribution and an illumination angle in accordance with a fourth preferred embodiment of the present invention.

In Table (7), the radius of curvature R of each optical surface from the source side to the project side along the central axis Z, the distance d (which is the on-axis surface spacing), the maximum angle 2ω of the light emitted from the LED die 11, and the maximum angle 2φ of the light with the distribution pattern projected from the optical lens 13, each refractive index ($N_d$), each Abbe's number ($v_d$), and each thickness are shown. Table (8) shows coefficients of aspherical equation (7) of each optical surface.

TABLE (7)

| | | $2\omega = 120$ $2\phi = 92$ | | | |
|---|---|---|---|---|---|
| No | Optical Surface | Radius of Curvature | Thickness | Nd | Vd |
| 0 | Light source | | 0.100 | | |
| 1 | Silicon Gel | | 0.430 | 1.527 | 34 |
| 2 | R1 | 37.635 | 1.850 | 1.583 | 57 |
| *3 | R2 | 2.400 | | | |
| 4 | Project side | | | | |

*Aspherical Surface

TABLE (8)

| | K | A4 | A6 | A8 | A10 |
|---|---|---|---|---|---|
| *R2 | 6.0000E−01 | 7.0000E−03 | −2.8000E−03 | 1.3700E−03 | −4.7870E−06 |

In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a glass material with the refractive index $N_{d2}$ equal to 1.530, and the Abbe's number $v_{d2}$ equal to 57. The LED die 11 emits a blue light with α=12.15 lumen, and the effective maximum angle=120°, and the effective focal length $f_s$ of the optical lens 13 equal to 4.30 mm. The blue light concentrated by the optical lens 13, and projected with a central illumination angle of 92° at a relative infinite distance (which is calculated by 100×$f_s$) and β=11.741 lumen (neglecting the refraction and scattering effect of the air). Equations (1), (2), (3), (5) and (6) are given below:

$\left|\dfrac{R_1 - R_2}{R_1 + R_2}\right| = 0.8801$ $\dfrac{R_1^2}{3 \cdot d_2 \cdot f_s} = 59.3053$ $(N_{d2} - 1)\dfrac{d_2}{f_s} = 0.2278$ $f_g = \left|\left(\dfrac{1}{R_1} - \dfrac{1}{R_2}\right) \cdot f_s\right| = 1.7931$ $\dfrac{\omega - \varphi}{\pi} \cdot f_g = 7.9905$ $\beta/\alpha = 96.63\%$ Equations (1), (2), (3) and (5) can be satisfied. FIG. 9 shows a schematic view of polar coordinates of a peak intensity distribution and an illumination angle of an LED assembly in accordance with a fourth preferred embodiment of the present invention. Tables (1) and (2) and FIG. 9 show that the aspherical LED angular lens for central distribution patterns has a simple shape, and an easy-to-manufacture feature, and the LED assembly has a predetermined pattern, and an uniform peak intensity for each angle, so as to enhance the applicability of the present invention.

Embodiment 5

Figure 10:
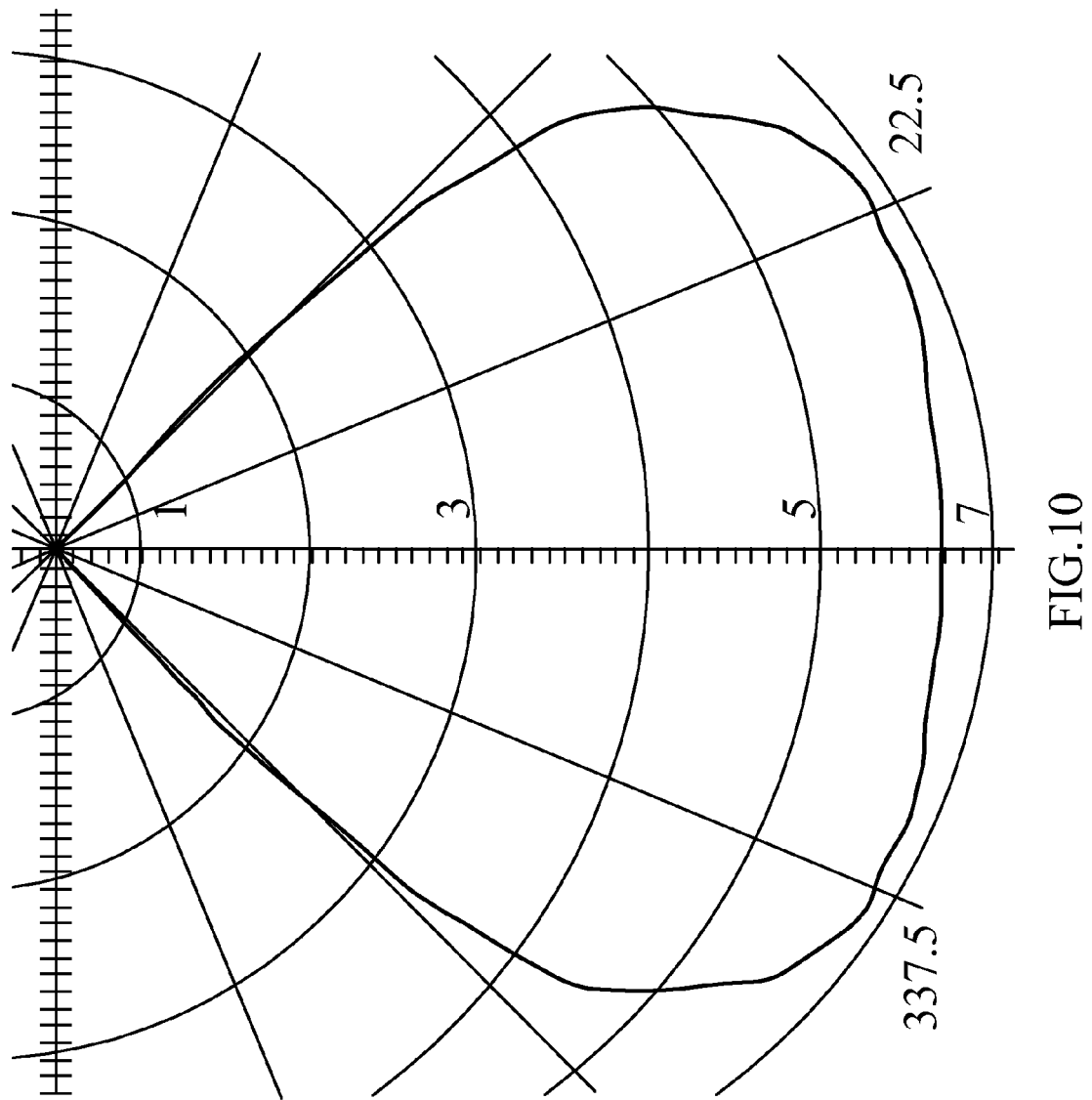
FIG. 10 is a schematic view of polar coordinates of a peak intensity distribution and an illumination angle of an LED assembly in accordance with a fifth preferred embodiment of the present invention.

Refer to FIGS. 4 and 10 for schematic views of an LED assembly using an optical lens and polar coordinates of a peak intensity distribution and an illumination angle in accordance with a fifth preferred embodiment of the present invention.

In Table (9), the LED die 11, the seal gel 12 and the optical lens 14 are arranged from the source side to the project side along the central axis Z, wherein the radius of curvature R (unit: mm) of the optical lens 13 at the optical surface $R_1$ of the source side, the radius of curvature R (unit: mm) of the optical lens 13 at the optical surface $R_2$ of the project side, and the distance d (which is the on-axis surface spacing) (unit: mm) are shown, and the maximum angle of the light emitted from the LED die 11 is equal to $2\omega$ (unit: degree), and the maximum angle of the light with the distribution pattern projected from the optical lens 13 is equal to $2\phi$ (unit: degree), and each refractive index ($N_d$), each Abbe's number ($v_d$), and each thickness are shown. Table (10) shows coefficients of aspherical Equation (7) of each optical surface.

TABLE (9)

| | | $2\omega = 120$ $2\phi = 90$ | | | |
|---|---|---|---|---|---|
| No | Optical Surface | Radius of Curvature | Thickness | Nd | Vd |
| 0 | Light source | | 0.100 | | |
| 1 | Silicon Gel | | 0.330 | 1.527 | 34 |
| 2 | R1 | ∞ | 2.800 | 1.583 | 61.7 |
| *3 | R2 | 2.975 | | | |
| 4 | Project side | | | | |

*Aspherical Surface

In Table (9), the optical surface (Surf) marked with* is an aspherical surface.

TABLE (10)

| | K | A4 | A6 | A8 | A10 |
|---|---|---|---|---|---|
| *R2 | 4.0000E-01 | 5.0000E-03 | -1.1000E-03 | 2.7122E-04 | -6.3827E-07 |

In this preferred embodiment, a seal gel 12 is filled with a transparent optical silicon gel with the refractive index $N_{d1}$ equal to 1.527 and the Abbe's number $v_{d1}$ equal to 34, and the optical lens 14 is made of a glass material with the refractive index $N_{d2}$ equal to 1.583, and the Abbe's number $v_{d2}$ equal to 61.7. With the refractive coefficients and Abbe's numbers of the seal gel 12 and the optical lens 13, a light refractive angle is defined. The LED die 11 emits a blue light with $\alpha=12.15$ lumen, and the effective maximum angle=120°, and the effective focal length $f_s$ of the optical lens 13 equal to 5.091 mm. The blue light concentrated by the optical lens 14, and projected with a central illumination angle of 90° at a relative infinite distance (which is calculated by 100×$f_s$) and $\beta=11.668$ lumen (neglecting the refraction and scattering effect of the air). Equations (3) to (6) are given below:

$(N_{d2} - 1)\dfrac{d_2}{f_s} = 1.7112$ $\dfrac{(d_0 + d_1 + d_2)}{R_2} = 1.0852$ $f_g = \left|\left(\dfrac{1}{R_1} - \dfrac{1}{R_2}\right) \cdot f_s\right| = 1.7112$ $\dfrac{\omega - \varphi}{\pi} \cdot f_g = 8.1705$ $\beta/\alpha = 96.03\%$ Equations (3) to (5) can be satisfied. FIG. 10 shows a schematic view of polar coordinates of a peak intensity distribution and an illumination angle of an LED assembly in accordance with a fifth preferred embodiment of the present invention. Tables (1) and (2) and FIG. 10 show that the aspherical LED angular lens for central distribution patterns has a simple shape, and an easy-to-manufacture feature, and the LED assembly has a predetermined pattern, and an uniform peak intensity for each angle, so as to enhance the applicability of the present invention.

Embodiment 6

Figure 11:
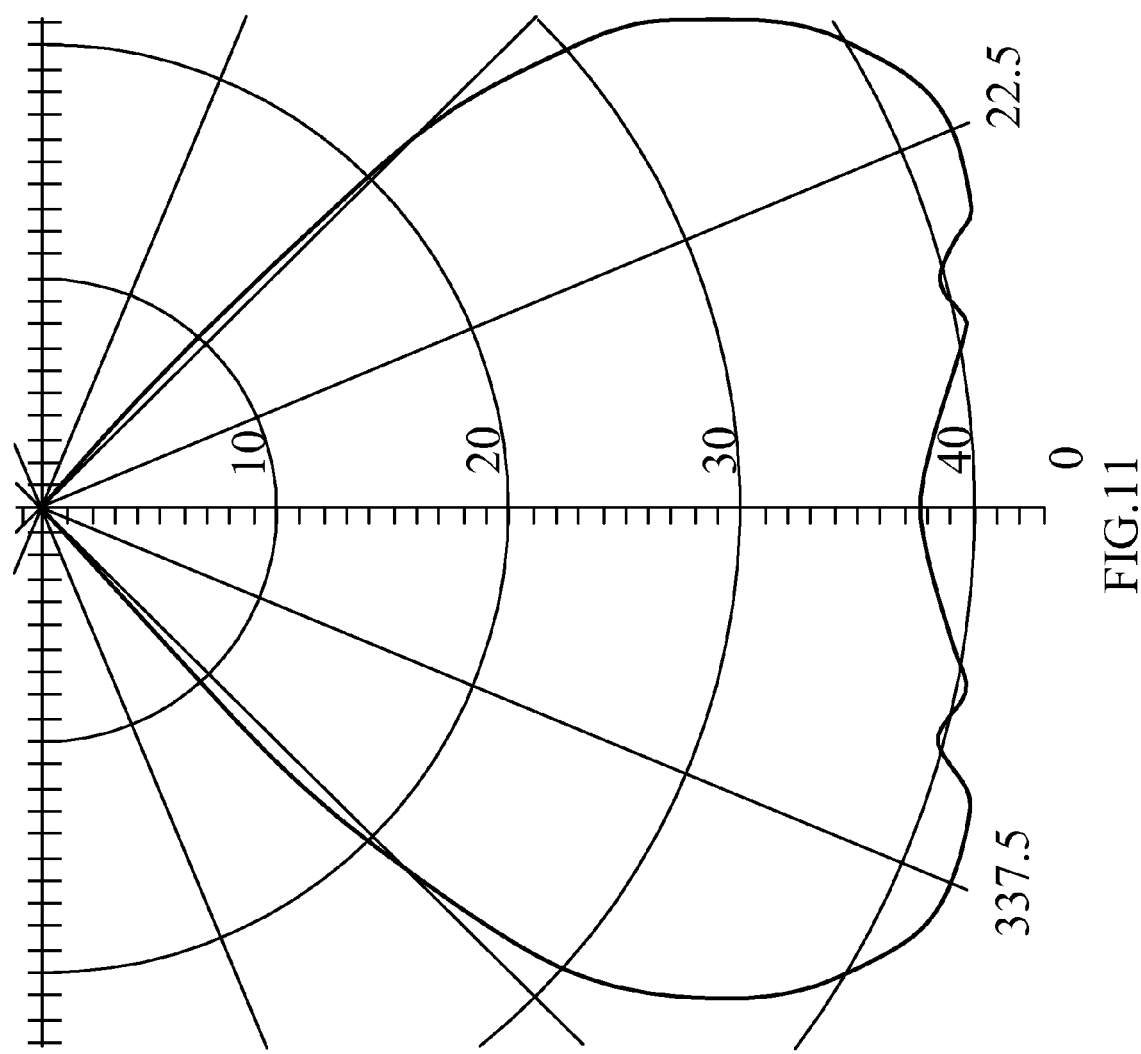
FIG. 11 is a schematic view of polar coordinates of a peak intensity distribution and an illumination angle of an LED assembly in accordance with a sixth preferred embodiment of the present invention.

Refer to FIGS. 4 and 11 for schematic views of an LED assembly using an optical lens and polar coordinates of a peak intensity distribution and an illumination angle in accordance with a sixth preferred embodiment of the present invention.

In Table (11), the LED die 11, the seal gel 12 and the optical lens 13 are arranged from the source side to the project side along the central axis Z, wherein the radius of curvature R (unit: mm) of the optical lens 14 at the optical surface $R_1$ of the source side, the radius of curvature R (unit: mm) of the optical lens 13 at the optical surface $R_2$ of the project side, and the distance d (which is the on-axis surface spacing) (unit: mm) are shown, and the maximum angle of the light emitted from the LED die 11 is equal to $2\omega$ (unit: degree), and the maximum angle of the light with the distribution pattern projected from the optical lens 13 is equal to $2\phi$ (unit: degree), and each refractive index ($N_d$), each Abbe's number ($v_d$), and each thickness are shown. Table (12) shows coefficients of aspherical Equation (7) for each optical surface.

TABLE (11)

| | | $2\omega = 120\ 2\phi = 90$ | | | |
|---|---|---|---|---|---|
| No | Optical Surface | Radius of Curvature | Thickness | Nd | Vd |
| 0 | Light source | | 0.100 | | |
| 1 | Silicon Gel | | 0.330 | 1.527 | 34 |
| 2 | R1 | ∞ | 2.800 | 1.583 | 61.7 |
| *3 | R2 | 2.975 | | | |
| 4 | Project side | | | | |

*Aspherical Surface

| | K | A4 | A6 | A8 | A10 |
|---|---|---|---|---|---|
| *R2 | 4.0000E−01 | 5.0000E−03 | −1.1000E−03 | 2.7122E−04 | −6.3827E−07 |

In this preferred embodiment, a seal gel 12 is filled with a transparent optical silicon gel with the refractive index $N_{d1}$ equal to 1.527 and the Abbe's number $v_{d1}$ equal to 34, and the optical lens 14 is made of a glass material with the refractive index $N_{d2}$ equal to 1.583, and the Abbe's number $v_{d2}$ equal to 61.7. With the refractive coefficients and Abbe's numbers of the seal gel 12 and the optical lens 14, a light refractive angle is defined. The LED die 11 emits a white light with α=78.5 lumen, and the effective maximum angle=120°, and the effective focal length $f_s$ of the optical lens 14 equal to 5.091 mm. The white light concentrated by the optical lens 14, and projected with a central illumination angle of 90° at a relative infinite distance (which is calculated by 100×$f_s$) and β=74.5 lumen (neglecting the refraction and scattering effect of the air). Equations (3) to (6) are given below:

$$(N_{d2} - 1)\frac{d_2}{f_s} = 0.3205$$

$$\frac{(d_0 + d_1 + d_2)}{R_2} = 1.0857$$

$$f_g = \left|\left(\frac{1}{R_1} - \frac{1}{R_2}\right) \cdot f_s\right| = 1.7111$$

-continued $$\frac{\omega - \varphi}{\pi} \cdot f_g = 8.1705$$

$$\beta/\alpha = 94.92\%$$

Equations (3) to (5) can be satisfied. FIG. 11 shows a schematic view of polar coordinates of a peak intensity distribution and an illumination angle of an LED assembly in accordance with a sixth preferred embodiment of the present invention. Tables (1) and (2) and FIG. 11 show that the aspherical LED angular lens for central distribution patterns has a simple shape, and an easy-to-manufacture feature, and the LED assembly has a predetermined pattern, and an uniform peak intensity for each angle, so as to enhance the applicability of the present invention.

Embodiment 7

Figure 12:
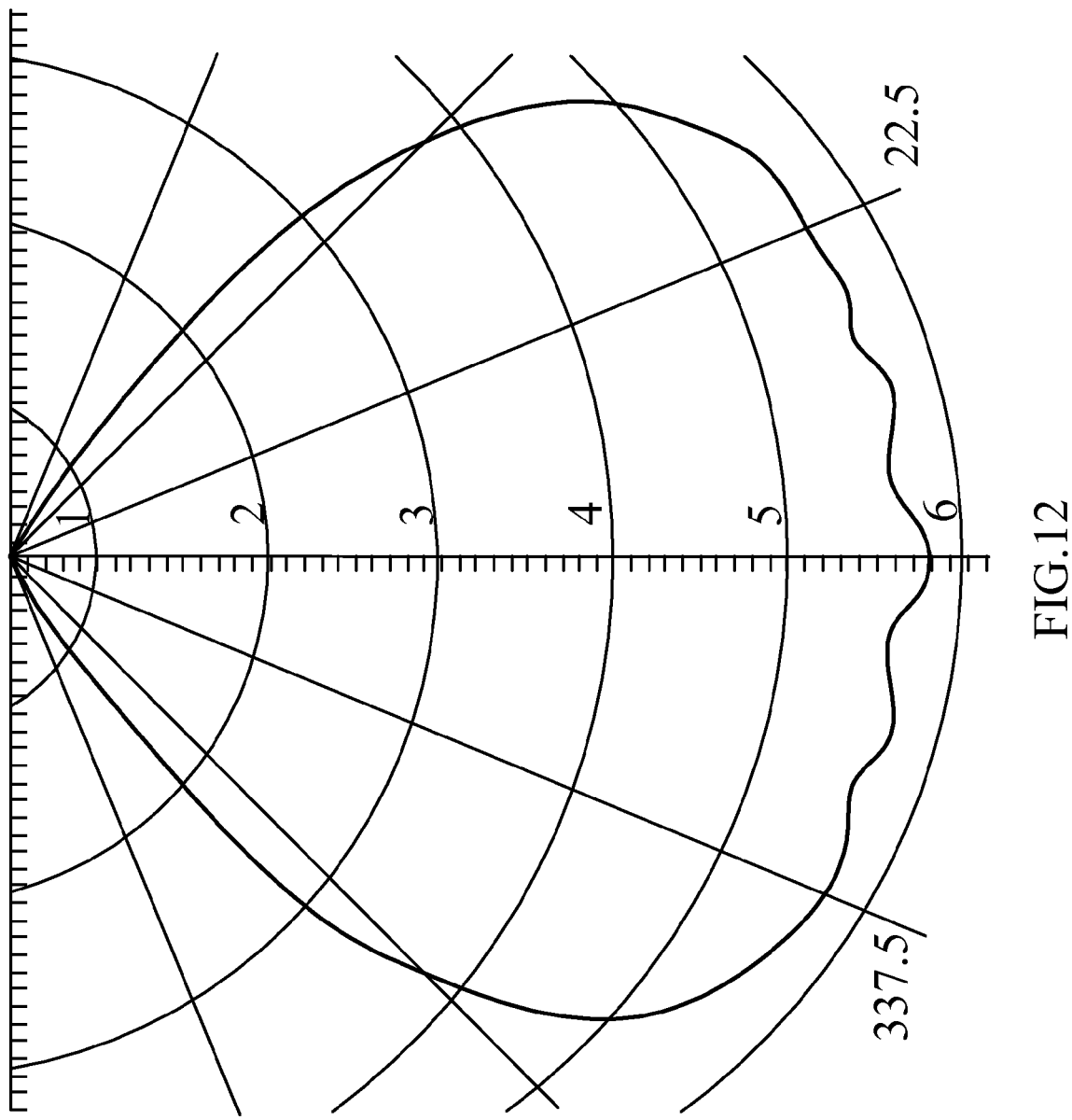
FIG. 12 is a schematic view of polar coordinates of a peak intensity distribution and an illumination angle of an LED assembly in accordance with a seventh preferred embodiment of the present invention.

Refer to FIGS. 4 and 12 for schematic views of an LED assembly using an optical lens and polar coordinates of a peak intensity distribution and an illumination angle in accordance with a seventh preferred embodiment of the present invention.

In Table (13), the LED die 11, the seal gel 12 and the optical lens 14 are arranged from the source side to the project side along the central axis Z, wherein the radius of curvature R (unit: mm) of the optical lens 14 at the optical surface $R_1$ of the source side, the radius of curvature R (unit: mm) of the optical lens 13 at the optical surface $R_2$ of the project side, and the distance d (which is the on-axis surface spacing) (unit: mm) are shown, and the maximum angle of the light emitted from the LED die 11 is equal to 2ω (unit: degree), and the maximum angle of the light with the distribution pattern projected from the optical lens 13 is equal to 2φ (unit: degree), and each refractive index ($N_d$), each Abbe's number ($v_d$), and each thickness are shown. Table (14) shows coefficients of aspherical Equation (7) for each optical surface.

TABLE (13)

| | | $2\omega = 120\ 2\phi = 91$ | | | |
|---|---|---|---|---|---|
| No | Optical Surface | Radius of Curvature | Thickness | Nd | Vd |
| 0 | Light source | | 0.100 | | |
| 1 | Silicon Gel | | 0.430 | 1.527 | 34 |
| 2 | R1 | ∞ | 2.600 | 1.530 | 57 |
| *3 | R2 | 2.975 | | | |
| 4 | Project side | | | | |

*Aspherical Surface

TABLE (14)

| | K | A4 | A6 | A8 | A10 |
|---|---|---|---|---|---|
| *R2 | 4.0000E−01 | 5.0000E−03 | −1.0000E−03 | 3.0000E−04 | −6.3827E−07 |

In this preferred embodiment, a seal gel 12 is filled with a transparent optical silicon gel with the refractive index $N_{d1}$ equal to 1.527 and the Abbe's number $v_{d1}$ equal to 34, and the optical lens 14 is made of a plastic material with the refractive index $N_{d2}$ equal to 1.530, and the Abbe's number $v_{d2}$ equal to 57. With the refractive coefficients and Abbe's numbers of the seal gel 12 and the optical lens 14, a light refractive angle is defined. The LED die 11 emits a blue light with α=12.15 lumen, and the effective maximum angle=120°, and the effective focal length $f_s$ of the optical lens 14 equal to 5.091 mm. The blue light concentrated by the optical lens 14, and projected with a central illumination angle of 90° at a relative infinite distance (which is calculated by 100×$f_s$) and β=11.74 lumen (neglecting the refraction and scattering effect of the air). Equations (3) to (6) are given below:

$$(N_{d2} - 1)\frac{d_2}{f_s} = 0.2707$$

$$\frac{(d_0 + d_1 + d_2)}{R_2} = 1.0521$$

$$f_g = \left|\left(\frac{1}{R_1} - \frac{1}{R_2}\right) \cdot f_s\right| = 1.7111$$

$$\frac{\omega - \varphi}{\pi} \cdot f_g = 7.8982$$

$$\beta/\alpha = 96.90\%$$

Equations (3) to (5) can be satisfied. FIG. 12 shows a schematic view of polar coordinates of a peak intensity distribution and an illumination angle of an LED assembly in accordance with a seventh preferred embodiment of the present invention. Tables (1) and (2) and FIG. 12 show that the aspherical LED angular lens for central distribution patterns has a simple shape, and an easy-to-manufacture feature, and the LED assembly has a predetermined pattern, and an uniform peak intensity for each angle, so as to enhance the applicability of the present invention.

Embodiment 8

Figure 13:
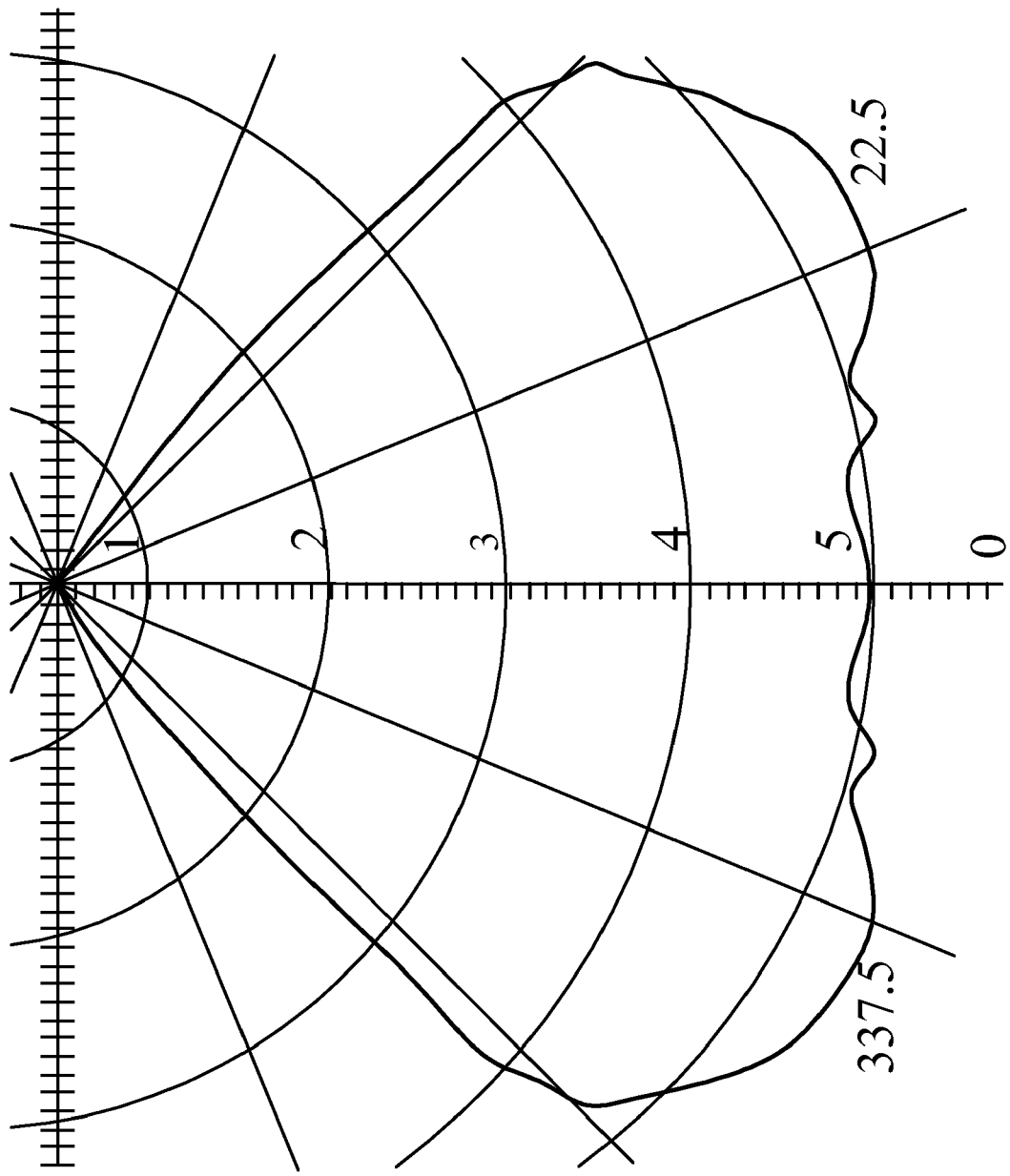
FIG. 13 is a schematic view of polar coordinates of a peak intensity distribution and an illumination angle of an LED assembly in accordance with an eighth preferred embodiment of the present invention.

Refer to FIGS. 4 and 13 for schematic views of an LED assembly using an optical lens and polar coordinates of a peak intensity distribution and an illumination angle in accordance with an eighth preferred embodiment of the present invention.

In Table (15), the LED die 11, the seal gel 12 and the optical lens 14 are arranged from the source side to the project side along the central axis Z, wherein the radius of curvature R (unit: mm) of the optical lens 14 at the optical surface $R_1$ of the source side, the radius of curvature R (unit: mm) of the optical lens 13 at the optical surface $R_2$ of the project side, and the distance d (which is the on-axis surface spacing) (unit: mm) are shown, and the maximum angle of the light emitted from the LED die 11 is equal to $2\omega$ (unit: degree), and the maximum angle of the light with the distribution pattern projected from the optical lens 13 is equal to $2\phi$ (unit: degree), and each refractive index ($N_d$), each Abbe's number ($v_d$), and each thickness are shown. Table (16) shows coefficients of aspherical Equation (7) for each optical surface.

TABLE (15)

$2\omega = 130 \; 2\phi = 92$

| No | Optical Surface | Radius of Curvature | Thickness | Nd | Vd |
|---|---|---|---|---|---|
| 0 | Light source | | 0.100 | | |
| 1 | Silicon Gel | | 0.430 | 1.527 | 34 |
| 2 | R1 | ∞ | 2.600 | 1.583 | 61.7 |
| *3 | R2 | 2.975 | | | |
| 4 | Project side | | | | |

*Aspherical Surface

TABLE (16)

| | K | A4 | A6 | A8 | A10 |
|---|---|---|---|---|---|
| *R2 | 4.0000E−01 | 5.0000E−03 | −1.0000E−03 | 3.0000E−04 | −6.3827E−07 |

In this preferred embodiment, a seal gel 12 is filled with a transparent optical silicon gel with the refractive index $N_{d1}$ equal to 1.527 and the Abbe's number $v_{d1}$ equal to 34, and the optical lens 14 is made of a glass material with the refractive index $N_{d2}$ equal to 1.583, and the Abbe's number $v_{d2}$ equal to 61.7. With the refractive coefficients and Abbe's numbers of the seal gel 12 and the optical lens 14, a light refractive angle is defined. The LED die 11 emits a blue light with $\alpha$=12.15 lumen, and the effective maximum angle=130°, and the effective focal length $f_s$ of the optical lens 14 equal to 5.091 mm. The blue light concentrated by the optical lens 14, and projected with a central illumination angle of 92° at a relative infinite distance (which is calculated by 100×$f_s$) and $\beta$=11.51 lumen (neglecting the refraction and scattering effect of the air). Equations (3) to (6) are given below:

$$(N_{d2} - 1)\frac{d_2}{f_s} = 0.2976$$

$$\frac{(d_0 + d_1 + d_2)}{R_2} = 1.0521$$

$$f_g = \left|\left(\frac{1}{R_1} - \frac{1}{R_2}\right) \cdot f_s\right| = 1.7112$$

$$\frac{\omega - \varphi}{\pi} \cdot f_g = 10.3493$$

$$\beta/\alpha = 94.70\%$$

Equations (3) to (5) can be satisfied. FIG. 13 shows a schematic view of polar coordinates of a peak intensity distribution and an illumination angle of an LED assembly in accordance with an eighth preferred embodiment of the present invention. Tables (1) and (2) and FIG. 12 show that the aspherical LED angular lens for central distribution patterns has a simple shape, and an easy-to-manufacture feature, and the LED assembly has a predetermined pattern, and an uniform peak intensity for each angle, so as to enhance the applicability of the present invention.

In summation of the description above, the aspherical LED angular lens for central distribution patterns and the LED assembly in accordance with the present invention has a simple shape, and uses plastic injection molding or glass molding process for their mass production, and thus they will not be deformed easily in production, so as to reduce the production cost and to enhance the productability. The optical lens having a flat surface and a convex surface can be furtherly used for simplifying the manufacturing process.

Another effect of the aspherical LED angular lens for central distribution patterns and its LED assembly in accordance with the present invention resides on that the light source projected from the LED die has a predetermined distribution pattern applicable for specific illumination conditions for illuminations and flash lights of cell phones or cameras.

A further effect of the aspherical LED angular lens for central distribution patterns and its LED assembly in accordance with the present invention resides on that the light source projected from the LED die maintains the uniform illumination intensity, so that no portion of the projective is be too bright or too dark, and the illumination quality is improved.

What is claimed is:

1. An aspherical LED angular lens for central distribution patterns, applied in an LED assembly, and having an LED die, a seal gel and an optical lens arranged along a central axis from a source side to an project side, in which:

the optical lens is a lens having a concave surface and a convex surface, and the concave surface is an optical surface facing the source side of the LED die, and the convex surface is an optical surface facing the project side of the LED die, and at least one of the optical surfaces is aspherical; and the optical lens satisfies the condition of:

$$0.7 \leq \left|\frac{R_1 - R_2}{R_1 + R_2}\right| \leq 1.0$$

where, $R_1$ is the radius of curvature of the optical lens at the optical surface of the source side, and $R_2$ is the radius of curvature of the optical lens at the optical surface of the project side, and wherein the optical lens satisfies the condition of:

$$0.2 \leq (N_{d2} - 1)\frac{d_2}{f_s} \leq 0.4$$

where, $f_s$ is the effective focal length of the optical lens, $d_2$ is the thickness of the optical lens on the central axis, and $N_{d2}$ is the refractive index of the optical lens.

2. The aspherical LED angular lens for central distribution patterns of claim 1, wherein the optical lens satisfies the condition of:

$$8 \leq \frac{R_1^2}{3 \cdot d_2 \cdot f_s} \leq 180;$$

where, fs is the effective focal length of the optical lens, $R_1$ is the radius of curvature of the optical lens at an optical surface of a source side, and $d_2$ is the thickness of the optical lens on the central axis.

3. The aspherical LED angular lens for central distribution patterns of claim 1, wherein the optical lens is made of a plastic material.

4. The aspherical LED angular lens for central distribution patterns of claim 1, wherein the optical lens is made of a glass optical material.

5. An LED assembly, comprising the aspherical LED angular lens for central distribution patterns as recited in claim 1, and an LED die, in which the LED assembly comprises a central distribution pattern greater than 72° and smaller than 108°, and satisfies the conditions:

$$5 \leq \frac{\omega - \varphi}{\pi} \cdot f_g \leq 12;$$

$$\text{where, } f_g = \left|\left(\frac{1}{R_1} - \frac{1}{R_2}\right) \cdot f_s\right|;$$

where, where $f_g$ is the relative focal length of the optical lens, $f_s$ is the effective focal length of the optical lens, $R_1$ is the radius of curvature of the optical lens at an optical surface of a source side, $R_2$ is the radius of curvature of the optical lens at an optical surface of an project side, ω is half of the maximum angle of a light emitted symmetrically from the central axis by the LED die, and φ is half of the maximum angle of a light symmetrically projected from the central axis by the optical lens.

6. The LED assembly of claim 5, wherein the LED assembly has a luminous flux ratio of a luminous flux of the emitted light and a luminous flux of an project side at a relative infinite distance, and the luminous flux ratio satisfies the condition of:

β/α≧85%;

where, α is the luminous flux of the light emitted from the LED die, and β is the luminous flux of the project side of the LED assembly at a relative infinite distance neglected the refraction and scattering in the air, provided that the refraction and scattering effects of the air are neglected.

7. The LED assembly of claim 5, wherein the aspherical LED angular lens for central distribution patterns is made of a plastic material.

8. The LED assembly of claim 5, wherein the Aspherical LED angular lens for central distribution patterns is made of a glass optical material.

\* \* \* \* \*